United States Patent [19]

Sokal et al.

[11] Patent Number: 4,607,323

[45] Date of Patent: Aug. 19, 1986

[54] CLASS E HIGH-FREQUENCY HIGH-EFFICIENCY DC/DC POWER CONVERTER

[76] Inventors: Nathan O. Sokal, 809 Massachusetts Ave., Lexington, Mass. 02173-3992; Richard Redl; Bela Molnar, both of P.O. Box 91, Budapest H-1502, Hungary

[21] Appl. No.: 601,381

[22] Filed: Apr. 17, 1984

[51] Int. Cl.[4] .......................... H02M 7/19; H03F 1/14

[52] U.S. Cl. .......................................... 363/97; 330/10; 330/251; 333/32; 363/21

[58] Field of Search ........................ 363/21, 30, 40, 97, 363/131, 126, 133; 330/10, 251, 279, 285; 333/32

[56] References Cited

U.S. PATENT DOCUMENTS 3,919,656 11/1975 Sokal et al. .......................... 330/251
4,323,959 4/1982 Check .................................. 363/28

*Primary Examiner*—Patrick R. Salce
*Assistant Examiner*—D. L. Rebsch
*Attorney, Agent, or Firm*—Charles Hieken

[57] ABSTRACT

A Class E switching-mode dc/dc power converter is obtained by adding a rectifier circuit at the output of a Class E dc/ac power inverter. It can operate at high efficiency at high switching frequencies. Further, the power switch is not subjected to high power dissipation or high second-breakdown stress while it is switching between the "on" and "off" states, even if the dc load on the power converter varies over a very wide range, e.g., from open-circuit to short-circuit. The high efficiency is achieved by shaping the waveforms of switch voltage and switch current so that the transitions of those two waveforms are displaced in time from each other. Then the power switch does not experience simultaneously high voltage and high current while switching. High efficiency and low stress on the switch are achieved under all load conditions by interposing a matching network between the output of the Class E dc/ac inverter and the input of the rectifier circuit. That matching network transforms the rectifier input impedance in such a way that the impedance presented to the output of the Class E dc/ac inverter is always in the range which generates switch voltage and current waveforms that yield low power dissipation and low second-breakdown stress during switching, for any value of dc load resistance at the output of the rectifier.

12 Claims, 21 Drawing Figures

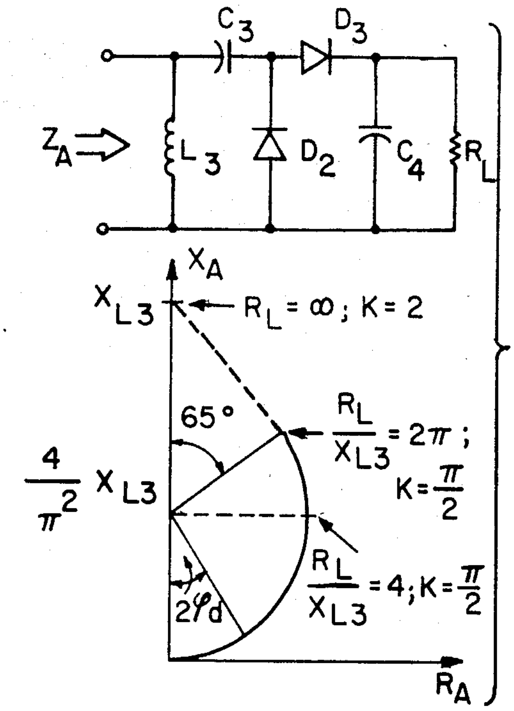
FIG. 10
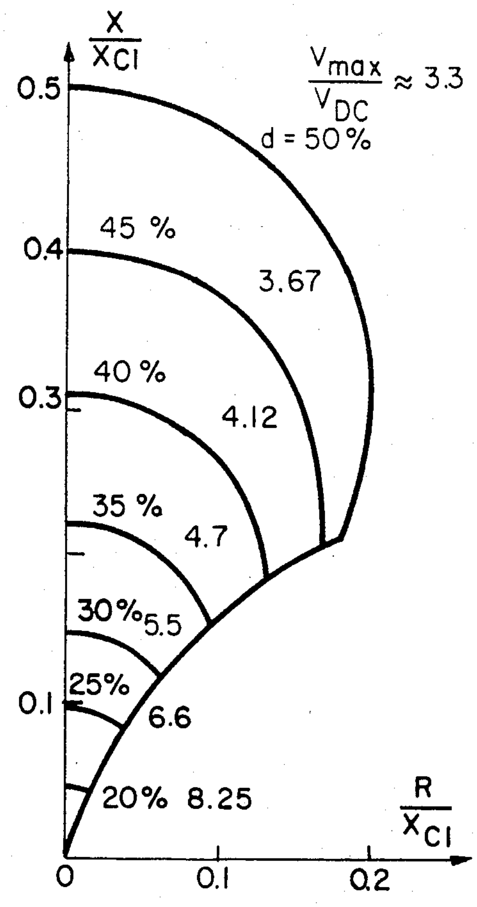
FIG. 11
FIG. 12
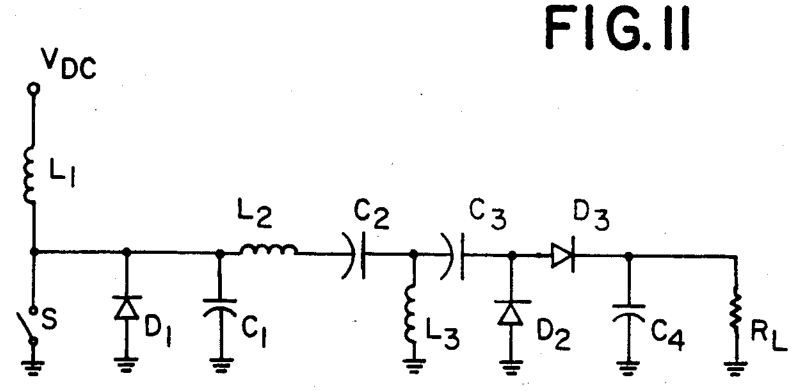
$$R_L = \frac{V_{OUT}^2}{P}$$
$$X_{L3} = \frac{R_L}{4}$$
$$X_{C1} = 5.82\,\frac{V_{DC}}{V_{OUT}}\,X_{L3}$$
$$X_{L2} = \frac{1}{\pi^2}\,R_L\,Q_L$$
$$X_{C2} = X_{L2}$$

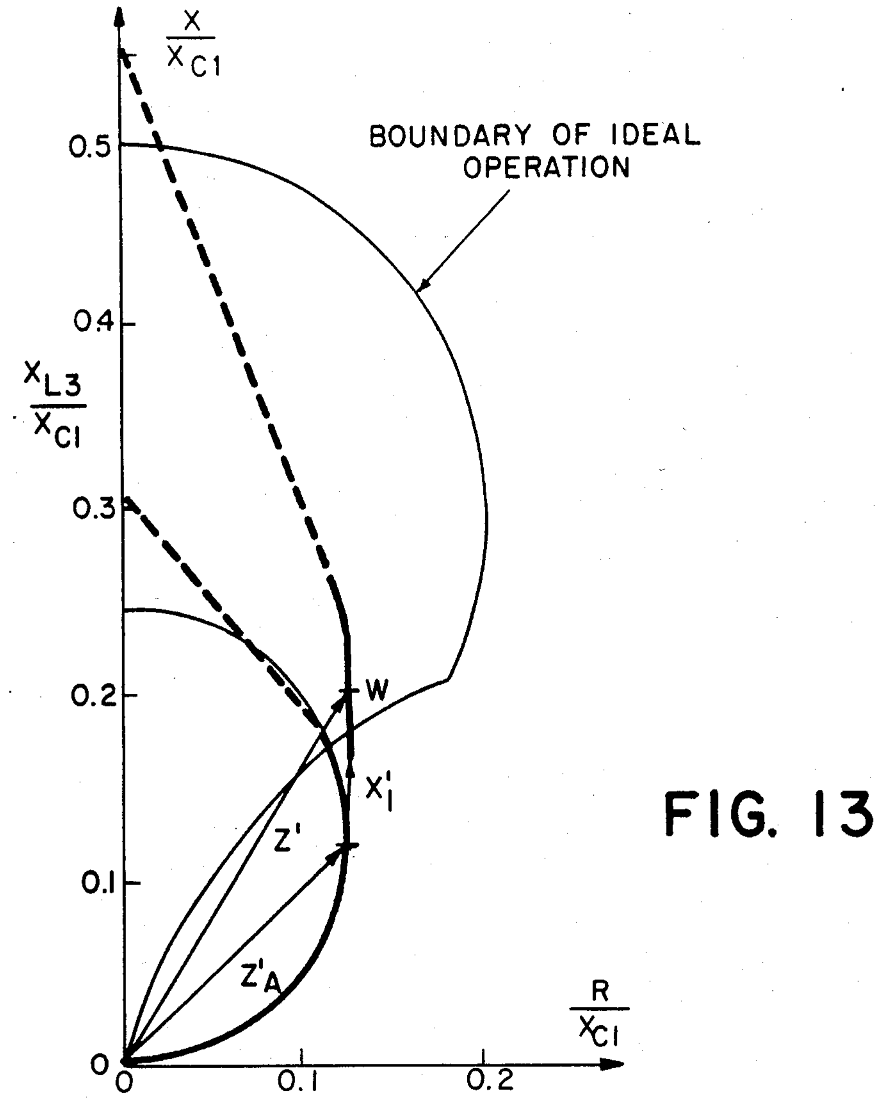
FIG. 13
FIG. 15
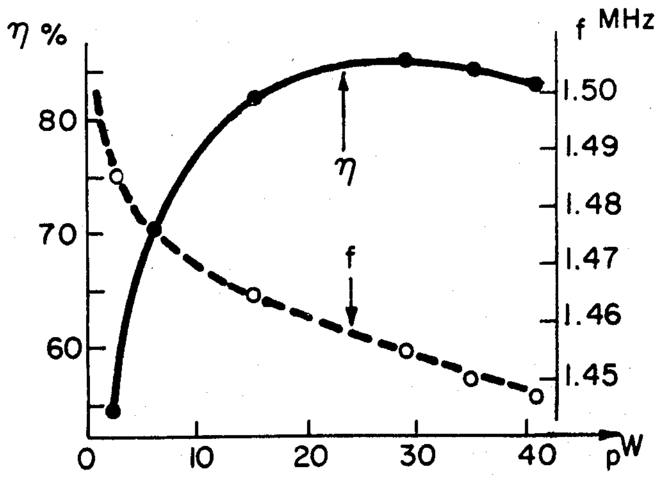

CLASS E HIGH-FREQUENCY HIGH-EFFICIENCY DC/DC POWER CONVERTER

I. FIELD OF THE INVENTION

This invention relates in general to switching-mode dc/dc power converters. It discloses, in particular, a circuit which can operate at high efficiency at high switching frequencies. Further, the power switch is not subjected to high power dissipation or high second-breakdown stress while switching, even if the load on the power converter varies over a very wide range, e.g., from open-circuit to short-circuit.

II. PRIOR ART

A. DC/DC Converters

A switching-mode dc/dc converter can be made smaller and lighter if the switching frequency is increased, because the inductors, transformers and capacitors can be smaller. However, increasing the switching frequency increases substantially the contribution, to total power dissipation, of the power dissipation which occurs during the switching of the power switch (usually a power transistor). For most types of dc/dc converter circuits in current use, it is difficult to obtain efficient operation at switching frequencies higher than about 200 kHz.

A list of documents at the end of the specification under the heading REFERENCES includes bracketed numerals used to identify a specific document in the discussion below.

B. Class E DC/AC Power Inverter

The Class E switching-mode dc/ac power inverter circuit [1], [2], [3] was conceived and developed specifically to obtain high-efficiency switching-mode power conversion at high switching frequencies. (In its original form, the circuit was an RF power amplifier, i.e., a dc-to-RF power inverter.) The Class E circuit achieves high efficiency at high frequencies by essentially eliminating the cause of the switching power dissipation which exists in almost all present-day switching-mode power inverters and converters: the simultaneous occurrence of high voltage across and switch and high current through the switch, during the times that the switch is making its transitions between the "on" and "off" states. That condition is eliminated in the Class E circuit by shaping the waveforms of switch voltage and switch current so that the transitions of those two waveforms are displaced in time from each other. Then the power switch does not experience simultaneously high voltage and high current while switching. The Class E circuit is described in detail in [1], [2] and [3], and in the further references cited there. We present here a summary description of how the waveform shaping is achieved.

1. Turn-on of power switch

In every switching-mode power converter, capacitance shunts the power switch. At the least, this capacitance is the inherent parasitic capacitance of the circuit components and wiring; the circuit designer might intentionally add additional capacitance (for reasons which will be discussed in connection with turn-off of the power switch). In prior-art power converters, the shunt capacitance is undesirable: If the switch is turned on when the voltage across the switch and its shunt capacitance is nonzero, the energy stored in the charged capacitance will be dissipated as heat; that energy is $CV^2/2$, where C is the capacitance shunting the switch and V is the voltage across the switch and the capacitor when the switch is turned on. If the switching frequency is f, the power dissipation is $CV^2f/2$. Note that the power dissipation is directly proportional to the switching frequency; for a high-frequency power converter, this power dissipation can become a severe drawback, especially in the many prior-art power converters in which V is large—of the order of double the dc power-supply voltage. In addition, while the switch is discharging the charged capacitor, the switch is subjected to both the capacitor voltage and the discharge current, simultaneously. If the simultaneous voltage and current are large enough, they can cause destructive failure of the power transistor by second breakdown of a bipolar junction power transistor or of the parasitic bipolar junction transistor which is contained within most field-effect power transistors. Those difficulties can be avoided by ensuring that the voltage across the switch will be substantially zero when the switch is turned on.

2. Turn-off of power switch

Most power-converter circuits inherently subject the power switch to simultaneous high voltage and high current (hence power dissipation and second-breakdown stress) while the switch is turning off. That condition can be avoided by delaying any substantial rise of the switch-voltage waveform until after the fall of the switch-current waveform has been substantially completed. We shall see shortly how that can be done.

It was seen above that capacitance shunting the switch is normally undesirable. The Class E circuit takes advantage of that otherwise undesirable capacitance by incorporating it into a delay circuit to delay the rise of switch voltage while the switch current is falling. The delay which is obtained is proportional to the capacitance shunting the switch. Depending on the parameters of a particular design, the designer might choose to add capacitance to the inherent parasitic capacitance.

3. Achieving low power dissipation and second-breakdown stress at both turn-on and turn-off of the power switch The simplest implementation of the Class-E circuit principles achieves low power dissipation and low second-breakdown stress at both turn-on and turn-off of the power switch by (a) using the switch shunt capacitance as part of a network which provides voltage delay at switch turn-off and (b) using a resonant load network whose transient response after the switch turn-off brings the switch voltage back to zero (or nearly zero) at the time the switch will next be turned on. The voltage and current waveshapes and the circuit topologies and component values are discussed in detail in [1], [2], and [3].

C. Class E DC/DC Converter

One can add a rectifier circuit at the output of a Class E dc/ac inverter and obtain dc from the rectifier output. Then the combination of the Class E dc/ac inverter and the rectifier acts as a dc/dc converter. If the rectifier is added in such a way that the Class-E high-efficiency waveforms are retained, one has a high-efficiency dc/dc converter which can operate at much higher switching frequencies than would be possible for that type of power switch in a conventional dc/dc converter circuit. Such a combination was described by Gutmann [4].

A potential problem with that arrangement arises because of the effects of varying the load impedance which is presented to the output of the Class E dc/ac inverter. That inverter generates its properly shaped waveforms for a specific nominal value of load impedance. As the load impedance is varied from the nominal value, the voltage and current waveforms at the power switch change from their nominal shapes. Although the Class E circuit has fairly low sensitivity to moderate variations of component values, extreme changes of component values can change the shapes of the waveforms enough to cause the power switch to be subjected, while switching, to large power dissipation and severe second-breakdown stress. That results in low efficiency of the power-conversion and possible destructive failure of the power switch.

In prior-art Class E dc/dc converters, the condition described above can result from an application requirement which is common for dc/dc converters: Frequently, a dc/dc converter is required to operate over a wide range of output load resistance (e.g., from no-load or light-load to full-load in normal operation, and from full-load to short-circuit under fault conditions). With prior-art circuits, certain dc load conditions can yield load impedances for the output of the Class E inverter which cause the undesirable and potentially destructive waveform conditions described above.

III. OBJECT OF THE INVENTION

The object of this invention is to permit the operation of a Class E dc/dc converter over a wide range of load resistance (e.g., from open-circuit to short-circuit) without subjecting the power switch to severe second-breakdown stress and/or power dissipation while switching.

IV. DESCRIPTION OF THE INVENTION

The object stated above is accomplished by including a matching network with the rectifier circuit. (Depending on the type of rectifier circuit being used, the components of the matching network can be located at the input or the output of the rectifier circuit, or can be incorporated within the rectifier circuit.) The matching network transforms the rectifier input impedance in such a way that the impedance presented to the output of the Class E dc/ac inverter is always in the range which results in switch voltage and current waveforms that yield low power dissipation and second-breakdown stress during the switching of the power switch, for any value of dc load resistance at the output of the rectifier, within a range chosen by the designer.

The desirable waveforms at the power switch are achieved when the load presented to the output of the Class E dc/ac inverter is a resistance in the range from zero to slightly higher than the nominal value. Undesirable waveforms are generated when the load is a resistance substantially higher than the nominal value. It is more difficult to describe in words the conditions about reactive loads. Specific numerical information is given in [2], FIG. 6, for the version of the Class E circuit discussed in that reference.

According to the invention, the input impedance of a rectifier circuit may be transformed for use with a Class E D/C A/C inverter. The specification gives a detailed quantitative analysis of a specific example: A half-wave voltage doubler. Alternatively, other rectifier circuits may be used, such as a half-wave rectifier circuit, or a full-wave bridge rectifier circuit.

For a capacitively loaded type of rectifier circuit, capacitively coupled to the output of the Class E dc/ac inverter, the desired impedance transformation is achieved by adding an inductive impedance in shunt with the input of the rectifier circuit. The inductance can be supplied as an inductor per se, or, for example, as the magnetizing inductance of a transformer which is used to couple the output of the Class E dc/ac inverter to the input of the rectifier.

If one uses, instead, a rectifier whose input impedance is inductive, one would use a capacitive impedance for the matching network, instead of the inductive impedance discussed above.

Numerous other features, objects and advantages of the invention will become apparent from the following specification when read in connection with the accompanying drawing in which:

FIG. 10 shows the locus of the input impedance of the rectifier;

FIG. 11 shows curves of constant voltage-related duty ratios in the Z′ plane;

FIG. 12 shows basic circuit topology and first-order design equations;

FIG. 13 is an impedance diagram of an exemplary converter according to the invention;

FIG. 15 is a graphical representation of efficiency and frequency as a function of output power for the converter of FIG. 14.

Figure 1:
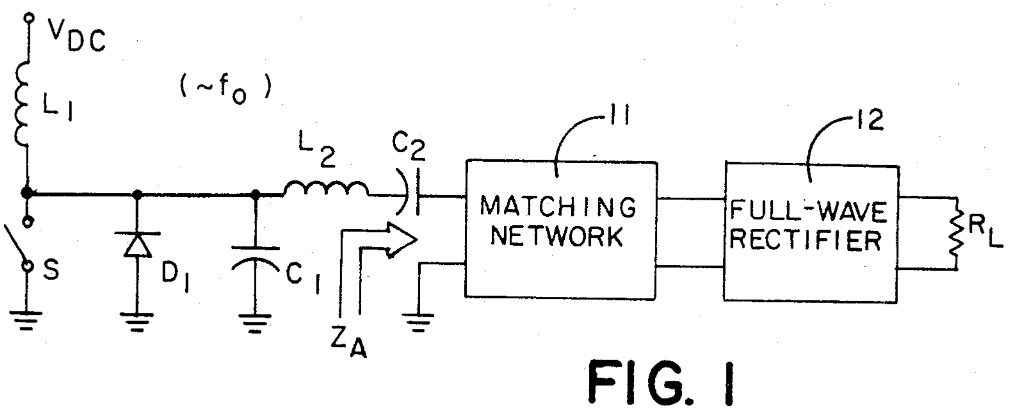
FIG. 1 is a combined block-schematic circuit diagram showing the basic topology of a system according to the invention.

With reference now to the drawing, and more particularly FIG. 1, there is shown a combined block-schematic circuit diagram illustrating the basic topology of a system according to the invention. The system comprises a controlled switch S, a diode $D_1$, a series resonant circuit $L_2$-$C_2$ (in general, not resonant at the switching frequency), a matching network 11 with input impedance $Z_A$ at the switching frequency, and a rectifier-filter stage 12 having a load resistance $R_L$. The cell is current-driven, which means the DC current flows into the cell from the primary DC power source. In practice, this is realized by a feed choke $L_1$ between the input voltage source $V_{DC}$ and the cell.

Figure 2:
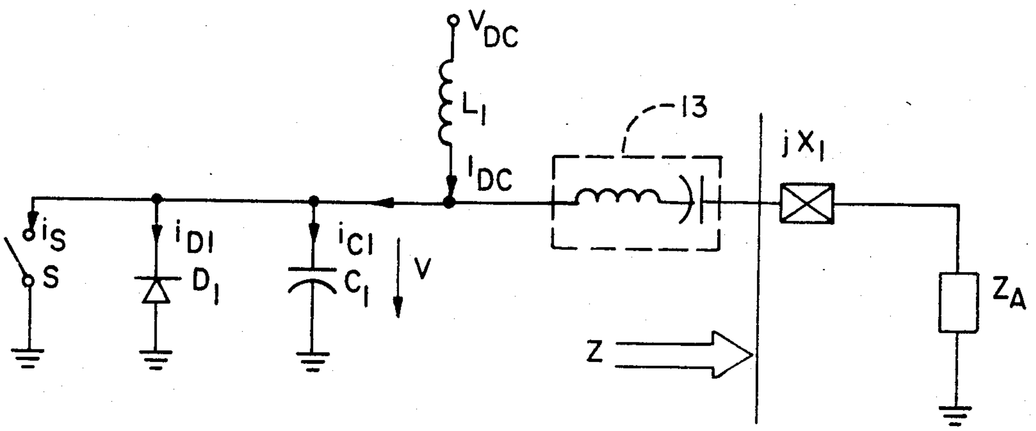
FIG. 2 is the equivalent circuit of the embodiment of FIG. 1.

Referring to FIG. 2, there is shown the equivalent circuit of the system of FIG. 1. The L-C tank in the dashed-line box 13 is $C_2$ of FIG. 1, together with the portion of $L_2$ which resonates with $C_2$ at the switching frequency. The remainder of $L_2$ is shown as $jX_1$. To simplify the analysis, without a great loss of accuracy, the "high-Q assumption" is made: the current flowing in the L-C tank 13 and $JX_1$ is assumed to be a pure sine wave. The combination of the matching network and the rectifier-filter-load gives impedance $Z_A$ at the switching frequency. For a regulated DC/DC converter, the frequency and/or the switch duty ratio must be varied in order to regulate against line and load variations. If the frequency is varied (the method used here), $jX_1$ and $Z_A$ change as the frequency is changed.

Assuming, at first, lossless circuit elements, the only source of power dissipation in the cell is the discharge of capacitor $C_1$ by the switch S. Therefore ideal (i.e., lossless) operation can be provided only if capacitor $C_1$ is at zero voltage at the time the switch turns on. The range of Z $(jX_1+Z_A)$ in which this "ideal" mode of operation exists is determined below.

Figure 3A:
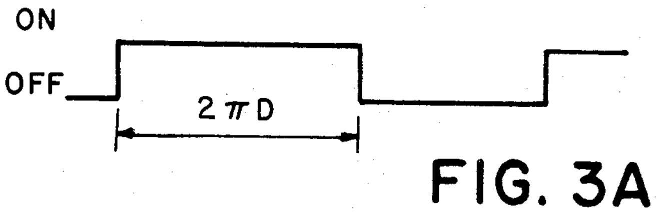
FIGS. 3A–3F show typical waveforms of a class-E cell.
Figure 3B:
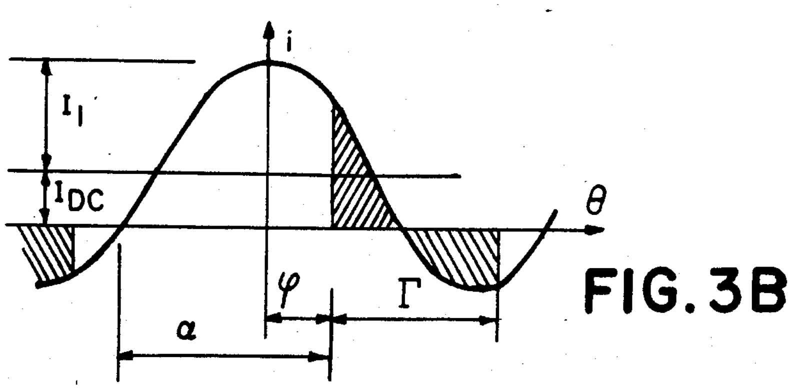
Figure 3C:
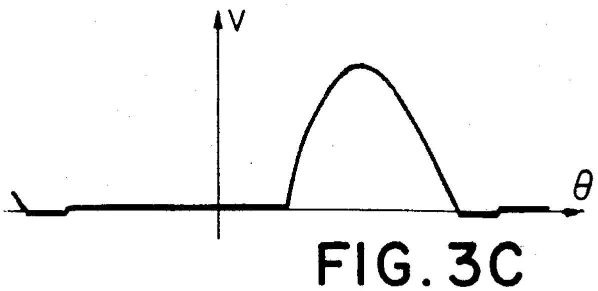
Figure 3D:
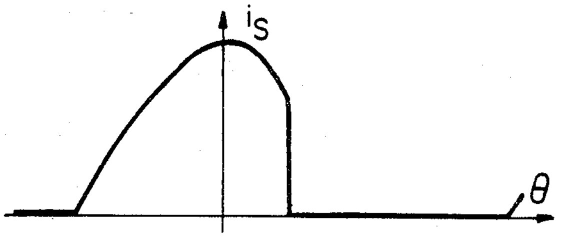
Figure 3E:
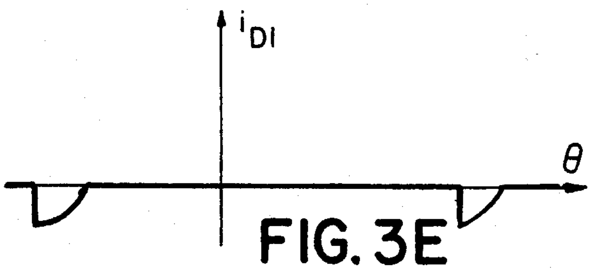
Figure 3F:
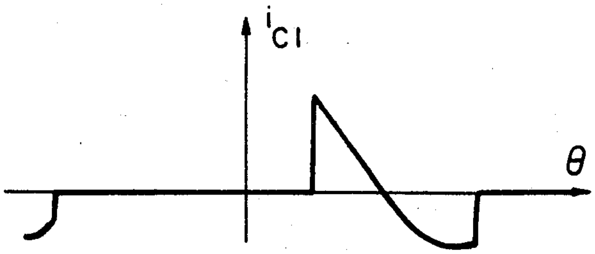

Referring to FIGS. 3A–3F, there are shown graphical representations of relevant signal waveforms plotted to a common time scale. FIG. 3A shows the state of switch S. FIG. 3B shows the current i in FIG. 2 flowing from the node joining feed choke $L_1$ and L-C tank 13. FIG. 3C shows the voltage v at that node, FIG. 3D shows the current $i_S$ through switch S, FIG. 3E shows the current $i_{D1}$ through diode $D_1$ and FIG. 3F shows the current $i_{C1}$ through capacitor $C_1$. The notations in FIGS. 3A–3F are as follows:

- $I_{DC}$: dc current flowing in the feed choke L1 .
- $I_1$: amplitude of sine-wave current flowing in the tank
- $\phi$: phase shift between the turn-off transition of the control signal and the peak of the tank current
- r: interval (expressed in radians) when neither S nor D conducts
- $\alpha$: interval (expressed in radians) when S conducts
- D: duty ratio of the drive signal to S
- $\theta$: $\omega t$ The real component of the impedance Z is positive because no power-supplying active devices are included in Z. Hence $$Re\, Z \geqq 0. \tag{1}$$

The conditions of ideal (lossless) operation in terms of $\Gamma$ and $\alpha$ are $$\Gamma \leqq 2\pi(1-D) \tag{2}$$

and $$\alpha \leqq 2\pi D. \tag{3}$$

Subsequently it will be assumed that the duty ratio is fixed, at 50%. That means that the boundaries of ideal operation are $$\Gamma = \pi \tag{4}$$

$$\alpha = \pi. \tag{5}$$

In the classical Class-E amplifier [1], [2], (4) and (5) are met at the same time.

The current i (in FIG. 2) can be written as $$i = I_{DC} + I_1 \cos\theta. \tag{6}$$

From the definition of $\alpha$, $$i(\theta=\phi-\alpha)=0. \tag{7}$$

(6) and (7) give $$I_{DC}/I_1 = -\cos(\phi-\alpha). \tag{8}$$

Equality of the shaded areas in FIG. 3 means that $$\int_{\phi}^{\phi+\Gamma} i\, d\theta = 0. \tag{9}$$

Substituting (6) into (9) yields $$I_{DC}/I_1 = (1/\Gamma)\,[\sin\phi - \sin(\phi-\Gamma)]. \tag{10}$$

From (8) and (10), $$\tan\phi = \frac{\sin\Gamma - \Gamma\cos\alpha}{1-\cos\Gamma+\Gamma\sin\alpha}. \tag{11}$$

$$I_{C1} = \frac{1}{\pi}\int_{\phi}^{\phi+\Gamma} i\, e^{-j\theta} d\theta. \tag{12}$$

The fundamental component of the voltage on $C_1$ is $$V_{C1} = V_1 = -jX_{C1} I_{C1}, \tag{13}$$

where $$X_{C1} = 1/\omega C1. \tag{14}$$

The impedance Z in FIG. 2 (taking into account the the impedance of the ideal tank is zero at the fundamental frequency) is $$Z = -V_1/I_1 = (jX_{C1}/\pi I_1)\int_{\phi}^{\phi+\Gamma} i\, e^{-j\theta} d\theta. \tag{15}$$

Substituting (6) into (15) results in a normalized impedance $$Z' = Z/X_{C1} = (1/\pi)[\tfrac{1}{2}j\Gamma - \tfrac{1}{4}e^{-j2\phi}(e^{-j2\Gamma}-1) - (I_{DC}/I_1)e^{-j\phi}(e^{-j\Gamma}-1)]. \tag{16}$$

THE REGION OF IDEAL OPERATION

At 50% switch duty ratio, (10) can be written as $$I_{DC}/I_1 = (2/\pi)\sin\phi. \tag{17}$$

This gives, for the normalized impedance Z':

$$Z' = (1/\pi)[\tfrac{1}{2}j\pi + (4/\pi)(\sin\phi)e^{-j\phi}]. \tag{18}$$

Figure 4:
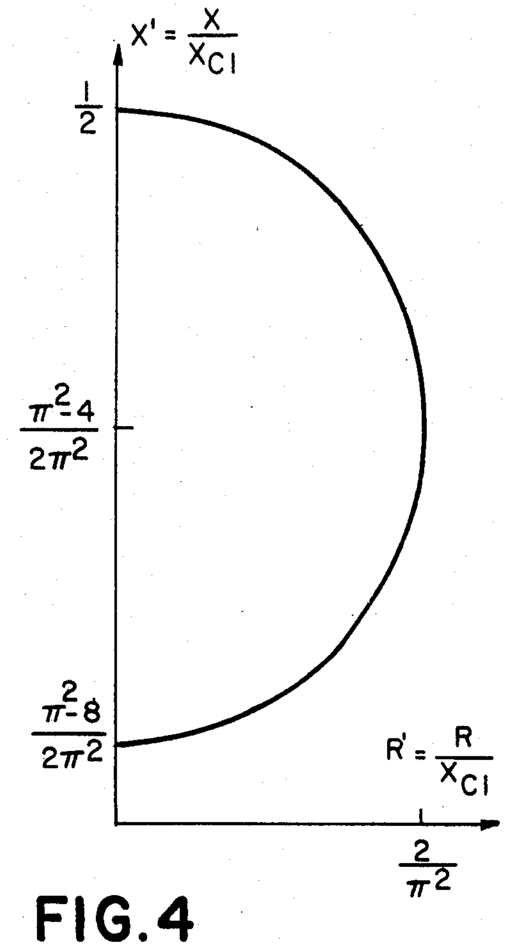
FIG. 4 shows the locus of the nonconducting interval $=\pi$ in the complex Z′ plane.

Taking into account that $$\sin\phi = (e^{j\phi}-e^{-j\phi})/2j, \tag{19}$$

$$Z' = (\tfrac{1}{2} - 2/\pi^2)j + j(2/\pi^2)e^{-j2\phi}, \tag{20}$$

which is the equation of a circle in the Z' plane, half of which is shown in FIG. 4 for $\Gamma=\pi$.

Condition (5) means that the current in the parallel combination of the switch and the diode is always unidirectional, i.e., positive. The corresponding part of the boundary can be determined only numerically. From (11), $$\tan\phi=(\Gamma+\sin\Gamma)/(1-\cos\Gamma), \qquad (21)$$

and from (8), $$I_{DC}/I_1=\cos\phi. \qquad (22)$$

The locus can be calculated point-by-point from the expressions (21), (22) and (16), with Γ as a variable.

Figure 5:
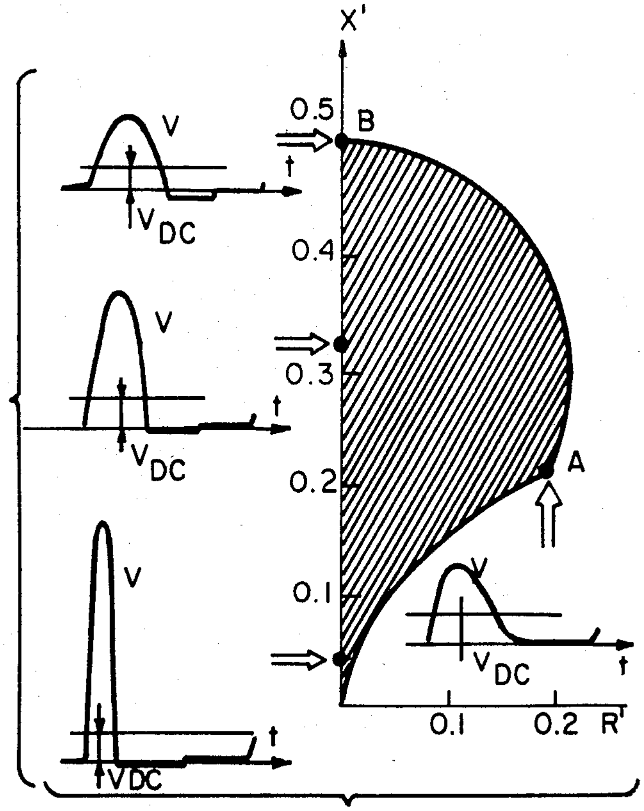
FIG. 5 shows the area of ideal lossless operation in the Z′ plane with characteristic waveforms at respective values of Z′ denoted by circles pointed to by arrows.

The complete region of ideal operation is displayed in FIG. 5, together with some characteristic voltage wave shapes (FIG. 3C type) for specific operating points designated A, B, C and D with arrows relating the waveforms to the specific operating points. Here point A indicates the classical Class E amplifier.

DETERMINATION OF THE OUTPUT VOLTAGE

The series tank separates the input and output sides of the cell, and only the fundamental-frequency current flows between them. Therefore, as a first approximation, the characterization of the system at this frequency is sufficient.

Let the transmission factor of the rectifier and the matching network 11, 12 be K. By definition, $$K=V_{out}/V_A, \qquad (23)$$

were $V_{out}$ is the output dc voltage and $V_A$ is the amplitude of the fundamental component of the voltage at the input port of the matching network.

Figure 6:
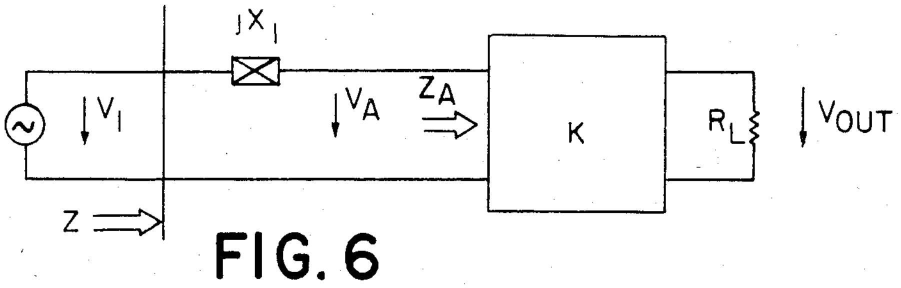
FIG. 6 is an equivalent circuit for determining output voltage.

The equivalent circuit for the calculation of the transmission factor is shown in FIG. 6. Here $Z_A$ is the input impedance of the matching network, and $jX_1$ represents the net reactance of the $L_2$-$C_2$ combination (in general, not tuned to the switching frequency). The output dc voltage can be written as $$V_{out}=K\,V_1\frac{|Z_A|}{|Z_A+jX_1|}. \qquad (24)$$

The source voltage V1 is a function of the terminating impedance Z. However, in the range of interest (shaded area in FIG. 5), the value of $V_1$ is almost constant, approximately $$V_1\approx 1.6\ V_{DC}. \qquad (25)$$

For example, at point A of FIG. 5, it is 1.64 $V_{DC}$; at point B it is 1.57 $V_{DC}$. Considerable deviation from 1.6 $V_{DC}$ occurs only near the origin. There, $$V_1\approx 2\ V_{DC}. \qquad (26)$$

Taking 1.6 as a good mean value, the output dc voltage is given as $$V_{out}\simeq 1.6\,K\,V_{DC}\frac{|Z_A|}{|Z_A+jX_1|}. \qquad (27)$$

Using (27), we could calculate the output voltage for a known impedance and a known input dc voltage if the transmission factor of the rectifier were available. That will be derived in the next section.

CHARACTERIZATION OF THE RECTIFIER

The input to the rectifier is a sine-wave of current. To rectify a sine-wave current, one can use any of the usual full-wave rectifier topologies (voltage-doubler, push-pull, bridge). (Half-wave circuits are less convenient to use because intermediate energy storage becomes necessary.) We used a full-wave voltage doubler in our exemplary circuit; we present here an analysis of that topology.

Figure 7:
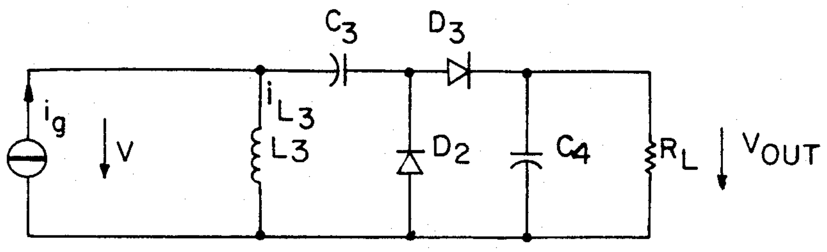
FIG. 7 is a schematic diagram of the combination of a matching network and rectifier (for specific illustration, a half-wave volage doubler), according to the invention.
Figure 8:
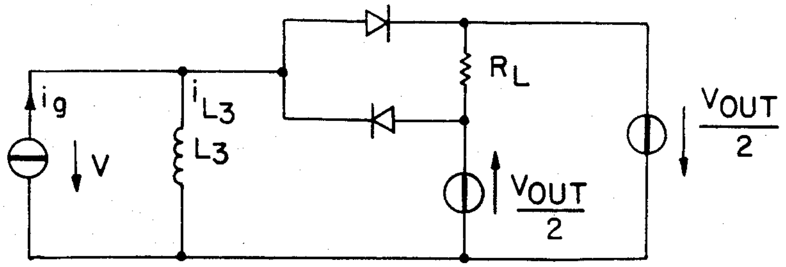
FIG. 8 is the equivalent circuit of the rectifier of FIG. 7

The circuit schematic is shown in FIG. 7, and a possible equivalent circuit is displayed in FIG. 8. The rectifier comprises two diodes ($D_3$, $D_4$) and two capacitors ($C_3$, $C_4$). The matching network is a single inductor $L_3$. The source is assumed to be a current generator 13 supplying a cosine-wave current at the switching frequency.

There are two different operating modes for the rectifier:

- discontinuous mode (in part of the period neither of the diodes conducts)
- continuous mode (there is always a diode conducting). In the following, the continuous mode will be treated in detail. The discontinuous mode occurs only at very light load, and is therefore of only minor interest. Further decreasing the level of interest in the discontinuous mode is the complexity of the mathematics necessary to analyze that case.

Figure 9A:
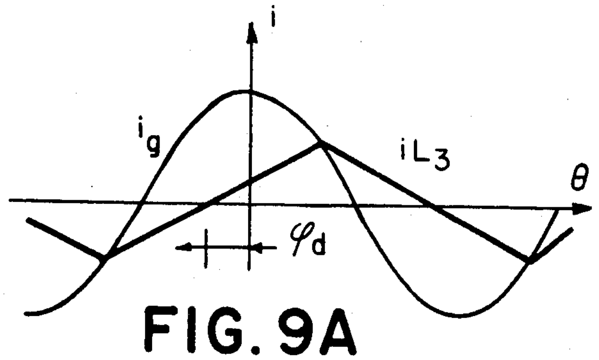
FIGS. 9A and 9B are waveforms of the rectifier shown to a common time scale.
Figure 9B:
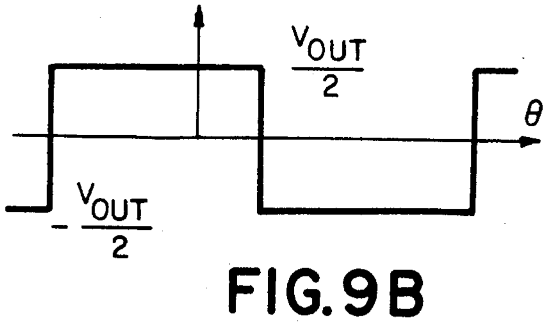

In the continuous mode of operation, the input voltage is a square-wave shown in FIG. 9B and the current in $L_3$ is a triangle-wave shown in FIG. 9A.

The current of the generator is given as $$i_g=I_g\cos\theta. \qquad (28)$$

The current in $L_3$ is $$i_{L3}=I_g(2/90)(\theta+\phi_d)\sin\phi_d; \qquad (29)$$

$\phi_d$ is the phase shift between the zero-crossing of $i_{L3}$ and the peak value of the generator current.

The dc current flowing in either of the two diodes is $$I_{DCd}=(\tfrac{1}{2}\pi)\int_{-\frac{\pi}{2}-\phi_d}^{\frac{\pi}{2}-\phi_d}(i_g-i_{L3})d\theta. \qquad (30)$$

Substituting (28) and (29) into (30) and carrying out the integration results in:

$$I_{DCd}=(1/\pi)I_g\cos\phi_d. \qquad (31)$$

The load resistance can be written as $$R_L=V_{out}/I_{DCd}=(V_{out}/I_g)(\pi/\cos\phi_d). \qquad (32)$$

The input voltage v is a square wave with a peak-to-peak value of $V_{out}$ and with phase shift $\phi_d$. Its fundamental component is:

$$V_A=(2/\pi)e^{j\phi_d}V_{out}. \qquad (33)$$

The input impedance of the rectifier is $$Z_A=V_A/I_g=(V_{out}/I_g)(2/\pi)e^{j\phi_d}. \qquad (34)$$

Dividing (34) by (32) gives $$Z_A/R_L=(2/\pi^2)\cos\phi_d e^{j\phi_d}. \quad (35)$$

The transmission factor of the rectifier is $$K=\frac{V_{out}}{|V_A|}=\pi/2. \quad (36)$$

Expressions (35) and (36) give the basic characteristics of the voltage-doubling rectifier. Similar derivations apply for other full-wave rectifiers, too.

The locus of $Z_A$ in the $Z_A=R_A+jX_A$ plane is of interest for the design of the dc/dc converter cell. It can be determined as follows.

From the definition of the inductance, $$\tfrac{1}{2}V_{out}=X_{L3}(d\,i_{L3}/d\,\theta). \quad (37)$$

Substituting the derivative of (29) into (37) yields $$\tfrac{1}{2}V_{out}=X_{L3}I_g(2/\pi)\sin\phi_d. \quad (38)$$

Solving (38) for $X_{L3}$, we obtain $$X_{L3}=(V_{out}/I_g)(\pi/4\sin\phi_d). \quad (39)$$

Dividing (32) by (39) we have $$R_L/X_{L3}=4\tan\phi_d. \quad (40)$$

Multiplying (35) by (40) results in $$Z_A/X_{L3}=(8/\pi^2)\sin\phi_d\,e^{j\phi_d}. \quad (41)$$
$$=(4/\pi^2)(j-j\,e^{j2\phi_d}.$$

That is the equation of a circle in the $Z_A$ plane (see FIG. 10).

At the boundary between the continuous and discontinuous operating modes, the slopes of the generator current and the current in $L_3$ are equal at the points of tangency. That is, at the time $$\theta=-\pi/2-\phi_{dcr},\ (d/d\theta)(i_g)=(d/d\theta)(I_{L3}), \quad (42)$$

where $\phi_{dcr}$ is the "critical value" of $\phi_d$, the value at the boundary. From Equations (28) and (29), $$I_g\sin[-\pi/2-\phi_{dcr}]=I_g(2\pi)\sin\phi_{dcr}. \quad (43)$$

The critical phase shift can be calculated from (43):

$$\tan\phi_{dcr}=\pi/2; \quad (44)$$

As mentioned previously, the analysis can be carried out for the discontinuous mode of operation in a similar way, but the results are more complicated and of less practical interest. (In most practical cases of light load, knowledge of the no-load operation is sufficient. In that case the rectifier works as a voltage-doubler, so $$K_{no\text{-}load}=2.) \quad (45)$$

MAXIMUM VOLTAGE IMPOSED ON THE SWITCH

A. Accurate Analysis

We can find the maximum voltage imposed on the switch by solving an expression for the voltage v as a function of time, for the value of time at which the voltage is known to be at its maximum value. First we find the time at which v is at its maximum value; that time is designated $\theta_M$. At that time, the current charging $C_1$ (i in FIG. 2) has just become zero, having been positive during the time that $C_1$ was being charged positive. Setting $i(\theta_M)$ to zero, we obtain from (6)

$$\cos\theta_M=-I_{DC}/I_1 \quad (47)$$

(46 not used)

Substitute (47) into (8):

$$\cos\theta_M=\cos(\phi-\alpha). \quad (48)$$

The positive solution is $$\theta_M=\alpha-\phi. \quad (49)$$

The voltage on $C_1$ and the switch is $$v=\frac{1}{2\pi C_1}\int_{\phi}^{\theta} i(\theta)d\theta. \quad (50)$$

The maximum voltage can be calculated from (50) by substituting (6) and (8) into (50) to find v as a function of $\theta$, and evaluating that function with $\theta$ set to $\theta_M$. We find v:

$$v=\frac{1}{2\pi C_1}\int_{\phi}^{\theta} I_1[\cos\theta-\cos(\phi-\alpha)]d\theta. \quad (51)$$

From this integral, the voltage peak can be determined accurately, setting $\theta$ to $\theta_M$.

B. Approximate Analysis

For design purposes, a simpler approximate expression will be accurate enough and will reduce the amount of mathematical manipulation needed. Write the maximum voltage in the following form:

$$V_{MAX}=\frac{k}{d}V_{DC}, \quad (52)$$

where d is the voltage duty ratio of the switch. (For d fraction of the period is every cycle, the switch voltage is nonzero). Recalling that $\Gamma$ is the portion of the cycle (in radians) during which neither S nor $D_1$ conducts, $$d=\Gamma/2\pi. \quad (53)$$

The numerical value of the factor k is a function of the terminating impedance, but k does not vary by more than 10% from its mean value of 1.65 over the range of impedances of interest. Taking k as approximately 1.65, we have $$V_{MAX}\approx V_{DC}1.65/d. \quad (54)$$

The curves of constant d are circles in the complex plane of impedance $Z_A$. The center of the circles is $$Z_o=(j/2\pi)[\Gamma-2/\Gamma+(2/\Gamma)\cos\Gamma], \quad (55)$$

and the radius is $$\rho=(\tfrac{1}{2}2\pi)[2/\Gamma-\sin\Gamma+(2/\Gamma)\cos\Gamma]. \quad (56)$$

FIG. 11 shows the impedance diagram with the constant d curves and the maximum voltages.

DESIGN CONSIDERATIONS

Ideally, the operating point should be maintained inside the area of lossless operation. However, practical experience indicates that the operating point can be slightly outside this area without incurring a large penalty. Thus, the dissipation coming from the discharge of $C_1$ increases at light load, but this is offset by the decrease of the ohmic losses of the power stage. Our experiments showed that 10% increase in the nominal output voltage (at the verge of ideal operation and at zero load) is quite tolerable. (The verge of ideal operation at zero load can be easily measured: here the supply current drawn from $V_{DC}$ is at minimum.)

The above-mentioned slight deviation from the ideal operation can be beneficial for two reasons:

the peak voltage stress at full load decreases, and the rms current flowing in the switch also decreases.

Another design constraint can be that the nominal operating point be that with the maximum real part of the impedance $Z_A$. From FIG. 10, we have at this point $$X_{L3} = R_L/4 \tag{57}$$

and $$R_A = X_{l3}\,(4/\pi^2). \tag{58}$$

From (57) and (58) we have, under that condition, $$R_A = R_L/\pi^2. \tag{59}$$

$L_3$ (or $X_{L3}$) can be determined from the no-load case. Here the following equations are valid:

$$Z_A = jX_{L3};\ k=2;\ Z_A + jX_1 = j0.5X_{C1} \tag{60}$$

According to (24) and (25)

$$\frac{V_{out}}{V_{DC}} = (1.6)(2)\frac{X_{L3}/X_{C1}}{0.5}. \tag{62}$$

Rearranging (61), we have $$X_{L3}/X_{C1} = (1/6.4)\,(V_{out}/V_{DC}).$$

Taking into account the 10% deviation of k from its mean values discussed above, results in the practical design equation for $X_{L3}$:

$$\frac{X_{L3}}{X_{C1}} = \frac{1.1}{6.4}\,\frac{V_{out}}{V_{DC}} = \frac{1}{5.82}\,\frac{V_{out}}{V_{DC}}. \tag{63}$$

FIG. 12 shows the first-order design equations and the circuit topology.

EXPERIMENTAL RESULTS

An experimental converter was designed and built to verify the theoretical results. The design parameters are: $V_{DC}$=12 V; P=40 W, $V_{out}$=22 V, $I_{out}$=1.8 A, f=1.5 MHz. From the equations of FIG. 12:

$$R_L = V_{out}2/P = 12.1 \text{ ohms} \tag{64}$$

$$X_{L3} = R_L/4 = 3.02 \text{ ohms} \tag{64}$$

$$L_3 = X_L/2\pi f = 0.32\ \mu H \tag{66}$$

$$X_{C1} = 5.82(V_{DC}/V_{out})X_{L3} = 9.59 \text{ ohms} \tag{67}$$

$$C_1 = \tfrac{1}{2}\pi f X_{C1} = 11.1nf \tag{68}$$

The output capacitance of the MOSFET switch used was about 1 nF; therefore, 10 nF external capacitance was built into the test circuit to realize the desired 11.1-nF value for $C_1$. With the available capacitor selection, C2 was chosen as 7.8 nF. This give $Q_L$=11 and $L_2$=1.44 μH.

FIG. 13 shows the determination of the operating region in the impedance diagram. The locus of the input impedance of the combination of the matching network and the rectifier is given by the smaller semicircle and its dashed-line continuation. The goal is to provide ideal (lossless) operation by moving the operating point into the area encircled by the boundary of ideal operation. The output voltage can be calculated from (27) if $V_{DC}$, k, $Z_A$ and $X_1$ are available. In a practical design case, however, the situation is reversed. $V_{DC}$, $V_{out}$, k and $Z_A$ are given, and $X_1$ must be determined. Or more precisely, $X_1$ is not of interest per se, but in order to have an appropriate value so that the operating point is inside the boundary of the region of ideal operation. Therefore, the construction for locating the operating point assumes the knowledge of the length and direction of the vector $Z_A$, the length of the vector Z and the direction of the third vector $X_1$.

Carrying out the simple geometrical construction with the design parameters for the experimental converter shows that at nominal load the operating point (W) is well within the boundary of the region of lossless operation. This is the case for loads which are lighter than nominal, too, except for very light or zero load, when the operating point moves out of the lossless area, at the top of the diagram.

Figure 14:
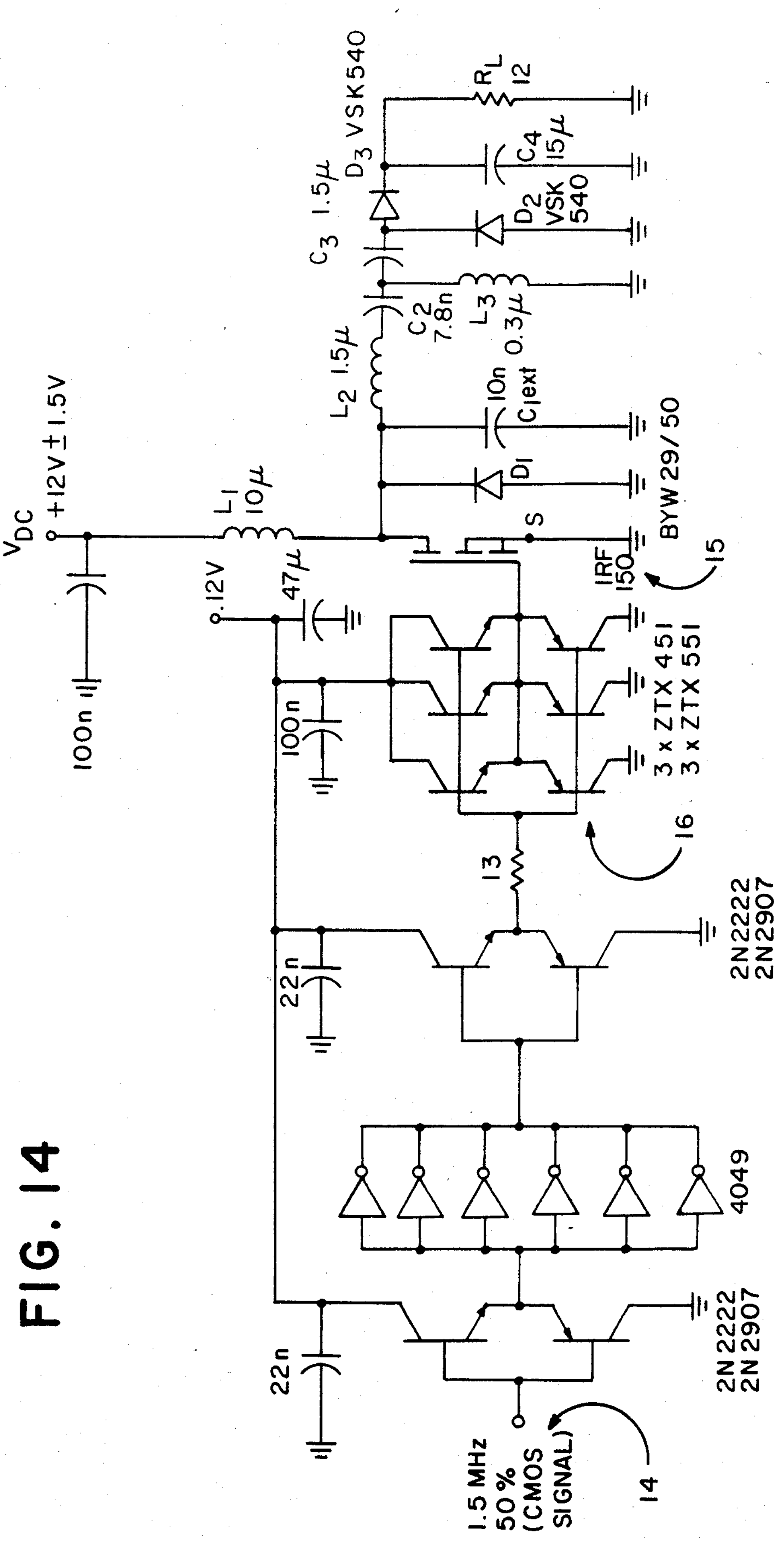
FIG. 14 is a schematic circuit diagram of the exemplary converter.

Referring to FIG. 14, there is shown a schematic circuit diagram of an exemplary embodiment of the invention. The input signal source comprised a laboratory RF generator set to 3 MHz, followed by a comparator and a CMOS flip-flop that provided a 1.5 MHz signal with exactly 50% duty ratio to input terminal 14. The MOSFET power switch 15 is driven by a complementary emitter follower 16 to charge or discharge the switch input capacitance in less than 50 ns (7.5% of the period.) (Each side of the emitter follower uses three paralleled T092 transistors). The power switch 15 is an International Rectifier IRF 150 MOSFET ($R_{DS}$ (on)=0.055 ohms, $BV_{DSS} \simeq 100$ V). Its anti-parallel diode is a fast-reverse-recovery (≃30 ns) rectifier. The output rectifiers D2 and D3 are Vero Semiconductor VSK 540 axial-led 5-A Schottky barrier rectifiers ($V_F \leqq 0.4$ V at 3A; $V_{RWM}$=40 V). Special care was paid to the physical layout of S-$D_1$-$C_1$ to minimize the inductances of the circuit loops formed by those components and minimize unwanted high-frequency resonances. Otherwise, the circuit operation is very insensitive to layout. Neither parasitic resonances nor instabilities due to parasitic feedback at the switching frequency were observed.

For this exemplary embodiment, the output voltage was regulated manually, by varying the switching frequency, set by the frequency of the laboratory RF signal generator. Table I and FIG. 15 show the performance as the input voltage was varied ±13% and the load was varied from no-load to full-load, with the frequency being set to maintain the output voltage at 22 V.

TABLE I

PERFORMANCE WITH VARYING INPUT VOLTAGE AND OUTPUT CURRENT

| $V_{DC}$ (V) | $V_{OUT}$ (V) | $I_{IN}$ (A) | $I_{OUT}$ (A) | f (MHz) | P (W) | n (%) |
|---|---|---|---|---|---|---|
| 12 | 22 | 0.374 | 0 | 1.550 | 0 | — |
| 12 | 22 | 0.453 | 0.135 | 1.485 | 2.97 | 54.6 |
| 12 | 22 | 0.699 | 0.271 | 1.475 | 5.96 | 71.1 |
| 12 | 22 | 1.48 | 0.680 | 1.465 | 15.0 | 84.2 |
| 12 | 22 | 2.84 | 1.32 | 1.455 | 29.0 | 85.2 |
| 12 | 22 | 3.48 | 1.59 | 1.450 | 35.0 | 83.8 |
| 12 | 22 | 4.07 | 1.85 | 1.447 | 40.7 | 83.3 |
| 10.5 | 22 | 4.7 | 1.85 | 1.415 | 40.7 | 82.5 |
| 13.5 | 22 | 3.6 | 1.85 | 1.470 | 40.7 | 83.7 |

By observing the waveform of the switch voltage, one can see whether the converter operating point is within or outside the region of ideal operation. If outside, the switch voltage will be positive at the time the switch turns on, and there will be a negative step in the voltage, when the switch discharges $C_1$ to ground. As expected from the analyses given above, the converter operation was in the ideal region for all load currents larger than 0.135 A.

There has been described novel high-frequency high-efficiency dc/dc power-conversion apparatus. The power switch operates with very low switching power loss, even if the switching transition times are an appreciable fraction of the period. It is evident that those skilled in the art may now make numerous modifications and uses of and departures from the specific apparatus and techniques disclosed herein without departing from the inventive concepts. Consequently, the invention is to be construed as embracing each and every novel feature and novel combination of features present in or possessed by the apparatus and techniques herein disclosed.

REFERENCES

[1] N. O. Sokal and A. D. Sokal, "Class E—a new class of high-efficiency tuned single-ended switching power amplifier," *IEEE J. Solid-State Circuits,* vol. SC-10, no. 3, June 1975, pp. 168–176.

[2] N. O. Sokal and A. D. Sokal, "Class E switching-mode RF power amplifiers—low power dissipation, low sensitivity to component tolerances (including transistors), and well-defined operation," IEEE ELECTRO/79 Conference (Session 23), New York, NY, Apr. 24–26, 1979; reprinted in R.F. Design, vol. 3, no. 7, pp. 33–38, 41, July/August 1980.

[3] N. O. Sokal and A. D. Sokal, "High-efficiency tuned switching power amplifier," U.S. Pat. No. 3,919,656, Nov. 11, 1975.

[4] R. F. Gutmann, "Application of RF circuit design principles to distributed power converters," *IEEE Trans. Industrial Electronics & Control Instrumentation,* vol. IECI-27, no. 3, August 1980, pp. 156–164.

[5] R. Redl, B. Molnar, and N. O. Sokal, "Class-E resonant regulated dc/dc power converters: analysis of operation, and experimental results at 1.5 MHz," 14th annual IEEE Power Electronics Specialists Conference, Albuquerque, NM, June 6, 1983; pp. 50–60 in the conference record, IEEE publication 83CH1877-0.

What we claim is:

1. A swithing mode dc/dc power converter comprising:

means for receiving input dc power, a Class E dc/ac power inverter having a switch operated at a switching frequency, coupled to said means for receiving input dc power and having an output with said inverter characterized by a switch voltage that is substantially zero at the time said switch is to be turned on, when the load impedance at said output is within a predetermined range of zero to slightly higher than a nominal load impedance value;

a rectifier circuit coupled to the output of said power inverter so as to rectify the ac output of said power inverter;

a matching network intercoupling said rectifier circuit and said output of said power inverter; and means for providing dc output power from said rectifier circuit;

wherein said matching network comprises means for transforming the input impedance of said rectifier circuit to present a load impedance within said predetermined range to said output of said power inverter.

2. The power converter of claim 1, wherein said matching network comprises an inductive impedance at the switching frequency.

3. The power converter of claim 2, wherein said matching network comprises an inductor.

4. The power converter of claim 1, wherein said matching network comprises an inductor in series with a capacitor.

5. The power converter of claim 1, wherein said matching network comprises an inductor in parallel with a capacitor.

6. The power converter of claim 1, wherein said matching network comprises a capacitive impedance at the switching frequency.

7. The power converter of claim 6, wherein said matching network comprises a capacitor.

8. The power converter of claim 2, wherein the inductive impedance is obtained from the magnetizing inductance of a transformer which couples the output of said Class E dc/ac inverter to the input of said rectifier circuit.

9. The power of converter of claim 1 and further comprising means for controlling the switching frequency to control said dc output power.

10. The power converter of claim 9 and further comprising means for receiving a reference signal, means for comparing the dc signal on the converter output with said reference signal to provide an error signal, and means responsive to said error signal for controlling the switching frequency, whereby the dc on the converter output tracks said reference signal.

11. The power converter of claim 10, wherein said reference signal is a dc reference.

12. The power converter of claim 10, wherein said reference signal is a time-varying signal.

* * * * *